United States Patent
Gilton et al.

(10) Patent No.: US 6,756,301 B2
(45) Date of Patent: *Jun. 29, 2004

(54) METHOD OF FORMING A METAL SEED LAYER FOR SUBSEQUENT PLATING

(75) Inventors: Terry L. Gilton, Boise, ID (US); Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/285,552

(22) Filed: Nov. 1, 2002

(65) Prior Publication Data

US 2003/0054632 A1 Mar. 20, 2003

Related U.S. Application Data

(63) Continuation of application No. 09/753,548, filed on Jan. 4, 2001, now Pat. No. 6,489,235, which is a continuation of application No. 09/285,668, filed on Apr. 5, 1999, now Pat. No. 6,221,763.

(51) Int. Cl.$^7$ .......................................... H01L 21/4763
(52) U.S. Cl. ...................... 438/643; 438/657; 438/678; 438/687
(58) Field of Search ................................. 438/663, 657, 438/678, 687, 627, 641, 653, 656

(56) References Cited

U.S. PATENT DOCUMENTS

| | | |
|---|---|---|
| 4,954,214 A | 9/1990 | Ho |
| 5,084,299 A | 1/1992 | Hirsch et al. |
| 5,308,796 A | 5/1994 | Feldman et al. |
| 5,348,574 A | 9/1994 | Tokas et al. |
| 5,354,712 A | 10/1994 | Ho et al. |
| 5,660,706 A | 8/1997 | Zhao et al. |
| 5,670,425 A | 9/1997 | Schinella et al. |
| 5,674,787 A | 10/1997 | Zhao et al. |
| 5,789,320 A | 8/1998 | Andricacos et al. |
| 5,968,333 A | 10/1999 | Nogami et al. |
| 5,969,422 A | 10/1999 | Ting et al. |
| 6,123,825 A | 9/2000 | Uzoh et al. |
| 6,221,763 B1 | 4/2001 | Gilton et al. |
| 6,287,968 B1 | 9/2001 | Yu et al. |
| 6,290,833 B1 | 9/2001 | Chen |

*Primary Examiner*—Phat X. Cao
*Assistant Examiner*—Theresa T. Doan
(74) *Attorney, Agent, or Firm*—Dickstein Shapiro Morin & Oshinsky

(57) ABSTRACT

A method of forming a metal seed layer, preferably a copper layer, for subsequent electrochemical deposition. The metal seed layer is formed by the oxidation-reduction reaction of a metal salt with a reducing agent present in a layer on the substrate to be plated. Metal interconnects for semiconductor devices may be produced by the method, which has the advantage of forming the metal seed layer by a simple electrochemical plating process that may be combined with the plating of the interconnect itself as a single-bath operation.

25 Claims, 5 Drawing Sheets

METHOD OF FORMING A METAL SEED LAYER FOR SUBSEQUENT PLATING

This application is a continuation of application Ser. No. 09/753,548, filed Jan. 4, 2001, now U.S. Pat. No. 6,489,235 (now allowed), which is a continuation of application Ser. No. 09/285,668, filed Apr. 5, 1999 (now U.S. Pat. No. 6,221,763), the subject matter of each of which is incorporated by reference herein.

FIELD OF THE INVENTION

The present invention relates to the field of electrochemical deposition, and in particular to a method of forming a metal seed layer by electroplating.

BACKGROUND OF THE INVENTION

The performance characteristics and reliability of integrated circuits have become increasingly dependent on the structure and attributes of the vias and interconnects which are used to carry electronic signals between semiconductor devices on integrated circuits or chips. Advances in the fabrication of integrated circuits have resulted in increases in the density and number of semiconductor devices contained on a typical chip. Interconnect structure and formation technology has lagged behind these advances, however, and is now a major limitation on the signal speed of integrated circuits.

Current techniques for forming vias and interconnects begin with preparation of the semiconductor wafer surface by formation of an interlevel dielectric layer (ILD), typically silicon dioxide. A mask may then be applied to pattern the deposition of the interconnect material on the wafer in the desired manner. Another typical process is to plate the interconnect material onto the surface of the wafer to a depth sufficient to fill the vias, followed by planarization to achieve the desired interconnect pattern.

Typically the preferred metal for use in the construction of integrated circuit interconnects has been aluminum. Aluminum is widely used because it is inexpensive, relatively easy to etch, and adheres well to ILDs such as silicon dioxide. Disadvantages of aluminum include significant electromigration effects, susceptibility to humidity-induced corrosion, and the tendency to "cold creep". "Cold creep" is a process that creates cracks or spaces between the interconnect layer and the ILD due to large variances in the coefficient of thermal expansion between the two materials.

The disadvantages of aluminum interconnects have become more pronounced as the geometry of integrated circuits continues to shrink. Chip designers have attempted to utilize different materials to construct an interconnect system having the chemical and mechanical properties which will complement and enhance smaller and faster circuit systems. The ideal interconnect material is inexpensive, and has low resistivity, minimal electromigration effects, high corrosion resistance, and a similar coefficient of thermal expansion to the ILD and substrate material. Metals possessing these properties include gold, silver, and copper, and research has generally focused on these three metals as new via and interconnect materials.

Copper is the most attractive material for use in integrated circuits because of its desirable chemical and mechanical properties. It is an excellent conductor with a resistivity of 1.73 microOhms per centimeter, is inexpensive, and is easily processed. Copper also has fewer electromigration effects than aluminum and can therefore carry a higher maximum current density, permitting a faster rate of electron transfer. The high melting point and ductility of copper produce far less cold creep during the semiconductor fabrication process than many other metals, including aluminum.

Although copper has many favorable characteristics, it also has disadvantages that may create fabrication problems for chip designers. Copper is soluble in silicon and most common ILDs, and exhibits a high rate of diffusion at temperatures associated with integrated circuit manufacturing. This diffusion can result in the creation of intermetallic alloys which can cause malfunctioning of the active semiconductor devices. In addition, copper exhibits poor adhesion to silicon dioxide which can result in broken connections and failure of electrical contacts.

Use of an intermediate barrier layer between the ILD and the copper interconnect permits the successful use of copper in a silicon-based integrated circuit. The barrier layer serves to eliminate the diffusion that would otherwise occur at the copper-ILD junction, and thus prevents the copper from altering the electrical characteristics of the silicon-based semiconductor devices. Such barrier layers are well known in the art and may be formed of a variety of transition metals, transition metal alloys or silicides, metal nitrides, and ternary amorphous alloys. The most common barrier layer materials in use are titanium, tantalum, and tungsten alloys due to their demonstrated ability to effectively reduce copper diffusion.

Deposition of a metallization layer generally occurs through one of the following techniques: chemical vapor deposition (CVD); physical vapor deposition (PVD), also known as sputtering; or electrochemical deposition. CVD involves high temperatures which can lead to cold creep effects and an increased chance of impurity contamination over other methods, and sputtering has problems yielding sufficient step coverage and density at small line widths. Electrochemical deposition, however, offers a more controlled environment to reduce the chance of contamination, and a process that takes place with minor temperature fluctuations. Electrochemical deposition provides more thorough coverage, fewer physical flaws, and reduces separation between the layers.

There are several known electrochemical deposition processes used to form copper interconnects onto barrier layers, each having various disadvantages. Direct deposition of copper onto the barrier layer typically results in porous films with poor adhesion and inconsistent densities. Annealing of the deposited copper at low temperatures may be performed to improve adhesion, but it increases cold creep effects and fails to provide a consistently dense copper structure. A copper seed layer may be formed over the barrier layer by CVD or PVD to produce an adhesive surface, and then electrochemical deposition may be carried out on the seed layer. This method involves multiple steps and increases production costs by requiring several different types of machines to form each interconnect layer.

What is needed, therefore, is a simple and inexpensive method of forming a metal seed layer that requires only a minimum number of steps for its production.

SUMMARY OF THE INVENTION

The present invention provides a method of forming a metal seed layer, preferably a copper layer, for subsequent electrochemical deposition. The metal seed layer is formed by the oxidation-reduction reaction of a metal salt or complex such as copper sulfate in acid solution, with a reducing agent such as elemental silicon that is present in a layer on the substrate to be plated. Preferably the reducing agent is present in a sacrificial layer on the substrate. The method is particularly suited to forming metal interconnects for semiconductor devices, because the metal seed layer and the plating of the interconnect itself may be combined into a single-bath operation.

Additional advantages and features of the present invention will be apparent from the following detailed description and drawings which illustrate preferred embodiments of the invention.

DETAILED DESCRIPTION OF PREFERRED EMBODIMENTS

Figure 1:
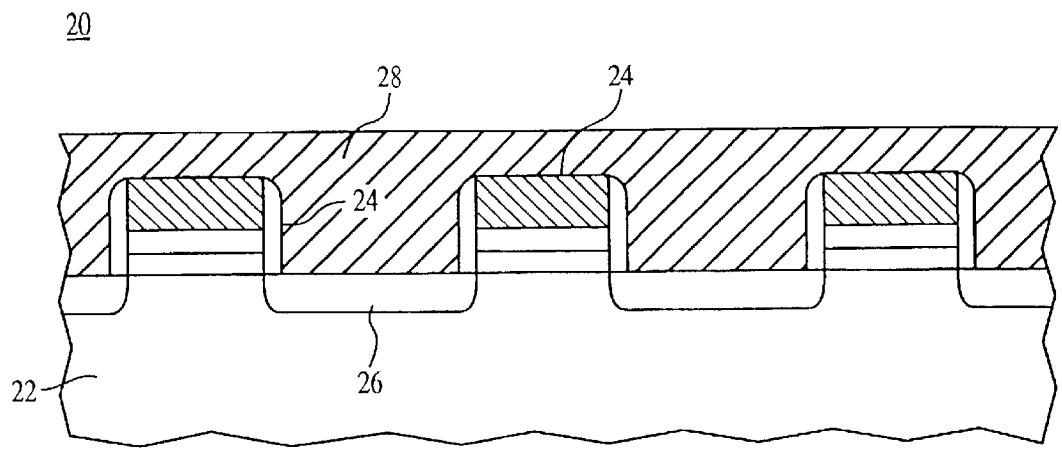
FIG. 1 is a cross-sectional view of a semiconductor wafer undergoing the process of a preferred embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical, electrical and chemical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. When referring to aqueous solutions described herein, the term "percent" refers to the percent measured by weight, e.g., a 10% hydrofluoric acid solution is 10% by weight hydrofluoric acid. The following description is, therefore, not to be taken in a limiting sense, and the scope of the present invention is defined by the appended claims.

Referring now to the drawings, where like elements are designated by like reference numerals, an embodiment of the present invention for manufacturing an integrated circuit having a metal interconnect is illustrated by FIGS. 1 through 6. The process creates a metal seed layer for subsequent electrochemical deposition by a oxidation-reduction ("redox") reaction between a reducing agent present in a sacrificial layer of material, and a metal salt or complex. For illustrative purposes the invention is described as a method of plating copper by a reaction in which the reducing agent is silicon, but the use of other metals and reaction mechanisms is to be understood as within the scope of the invention.

The process begins subsequent to the formation of a semiconductor device 20 containing devices 24, which may be transistors, capacitors, word lines, bit lines or the like, and active areas 26 on a silicon substrate 22, as shown in FIG. 1. A protective layer 28 of a material such as borophosphosilicate glass (BPSG), phosphosilicate glass (PSG), borosilicate glass (BSG), or silicon dioxide has been formed over the device 20 by chemical vapor deposition (CVD) or other suitable means.

Figure 2:
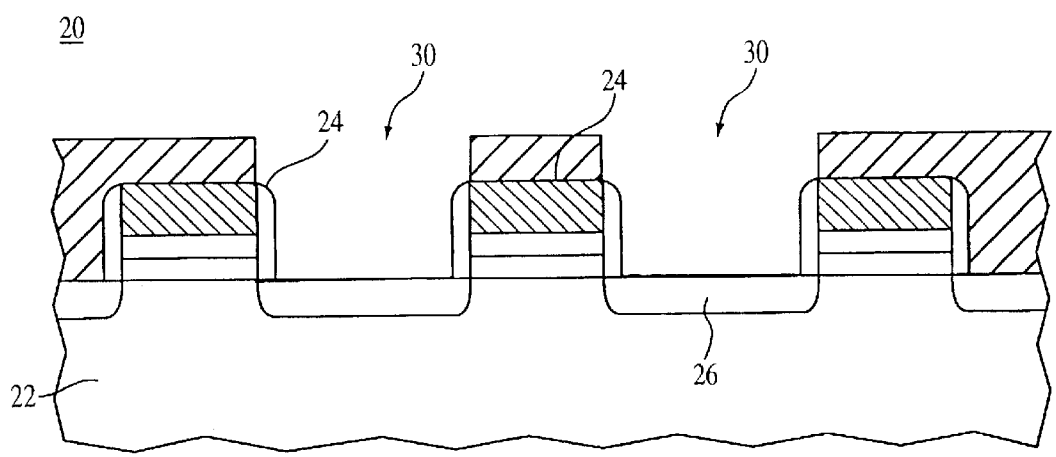
FIG. 2 shows the wafer of FIG. 1 at a processing step subsequent to that shown in FIG. 1.

The process of the present invention begins by applying a photoresist and mask (not shown), and by using photolithographic techniques to define areas to be etched out. Referring to FIG. 2, a directional etching process such as reactive ion etching (RIE) is used to etch through the protective layer 28 to form vias 30. The etchant used may be any suitable etchant that selectively etches the material of the protective layer 28 and not the active areas 26, the devices 24, or the material of sidewall or cap insulators on the devices 24.

Figure 3:
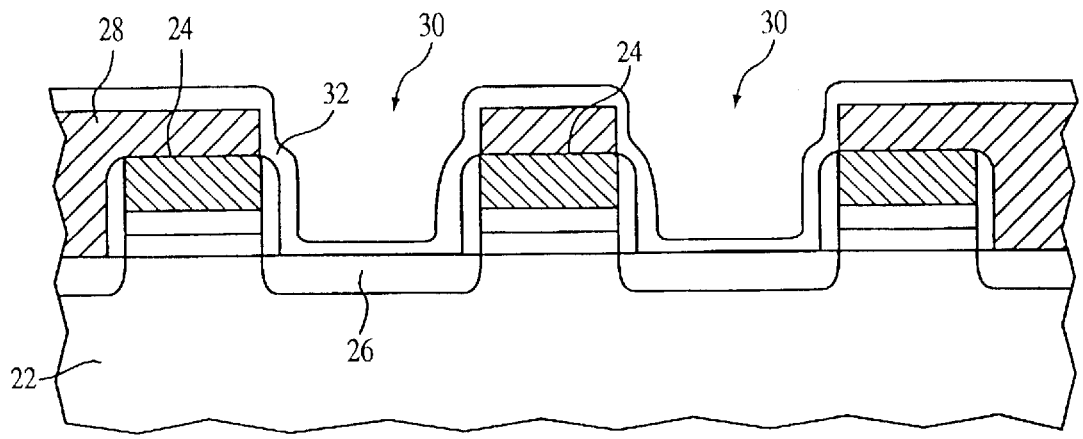
FIG. 3 shows the wafer of FIG. 1 at a processing step subsequent to that shown in FIG. 2.

FIG. 3 depicts the next step of the process, in which a barrier layer 32 is formed so that it overlies the protective layer 28 and lines the inside of the vias 30. Barrier layers are typically used with metal interconnect material to optimize performance of the interconnects, and to prevent diffusion of the metal interconnect material into the substrate. The barrier layer 32 may be formed of any suitable material such as titanium, titanium nitride, tantalum, tantalum nitride, tungsten nitride, tungsten-tantalum, tantalum silicon nitride, or other ternary compounds, and should be of a thickness within the range of 50 to 500 Angstroms, and preferably approximately 300 Angstroms thick. Chemical vapor deposition, physical vapor deposition (PVD), or other suitable means may be used to form the barrier layer 32.

Figure 4:
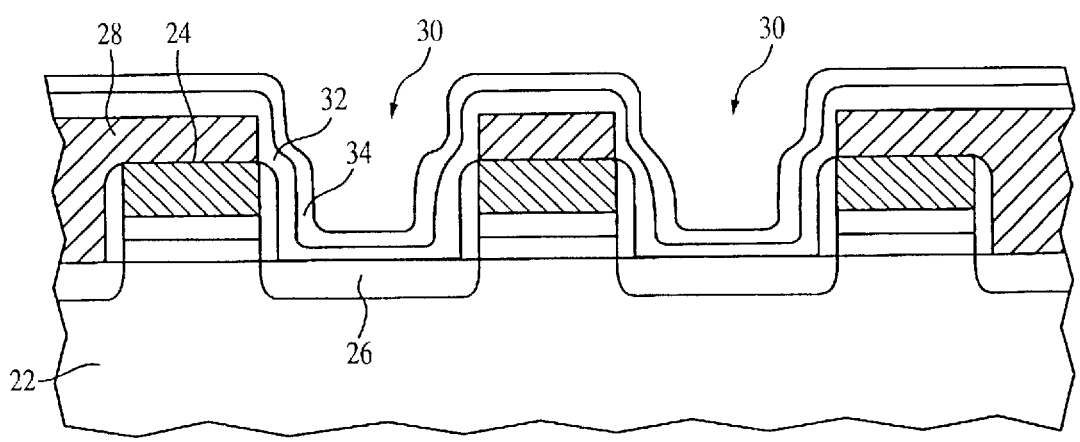
FIG. 4 shows the wafer of FIG. 1 at a processing step subsequent to that shown in FIG. 3.

Next, a sacrificial oxide layer 34 is formed over the barrier layer 32 and lining the inside of the vias 30, as shown in FIG. 4. The sacrificial oxide layer 34 is a layer of silicon-containing material such as silicon dioxide or silicon monoxide that is formed by means such as CVD, PVD, oxidation of the wafer in an ozone-containing rinse bath, or the like. Preferably the oxide is a chemical oxide. The sacrificial oxide layer 34 has a thickness within the range of 10 to 200 Angstroms, preferably 10 to 50 Angstroms, and should have a silicon-to-oxygen ratio of greater than 0.5. Depending on the reaction mechanism, a sacrificial oxide layer 34 may not be required, and a reactive barrier layer 32 may be used if there is a sufficient amount of the reducing agent present in the barrier layer 32.

Figure 5:
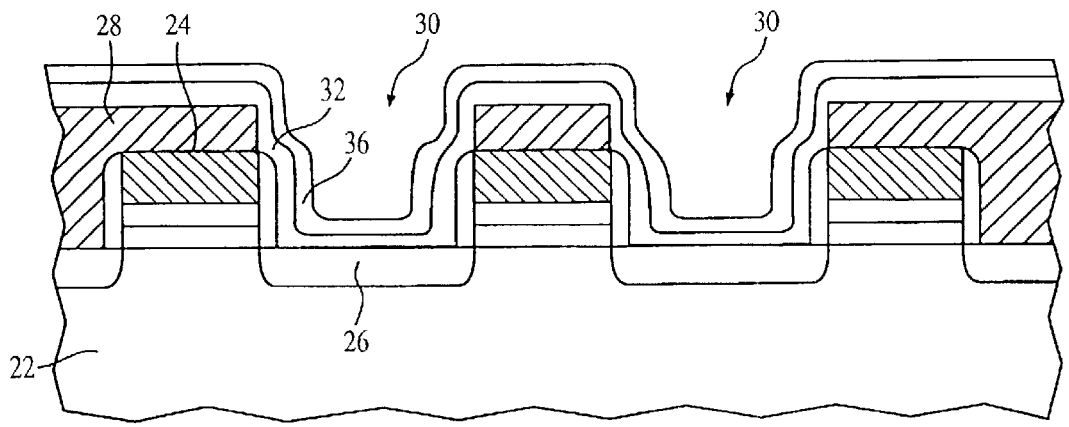
FIG. 5 shows the wafer of FIG. 1 at a processing step subsequent to that shown in FIG. 4.

FIG. 5 depicts the next step of the process, in which a metal seed layer 36 is now formed on the surface of the barrier layer 32 in the vias 30 by a redox plating process. The plating process is carried out by exposing the wafer 20 to a first plating solution by means such as immersion of the wafer 20 into a plating bath, or by spraying the plating solution onto the wafer 20. The first plating solution is an aqueous solution of an acid such as hydrofluoric acid or sulfuric acid, and a metal salt or complex that is soluble in the acid used. A redox reaction occurs between the metal ions in the solution, e.g., cupric ions ($Cu^{2+}$) and the reducing agent of the sacrificial oxide layer 34, e.g., silicon, leading to reduction of the metal ions and subsequent plating onto the barrier layer 32.

For example, in a copper plating process, a dilute solution of hydrofluoric acid (HF) and a salt such as copper sulfate ($CuSO_4$) is used to carry out the reaction with a sacrificial oxide layer 34 containing silicon as a reducing agent. Preferably a solution containing approximately 1 part hydrofluoric acid per 100 parts water, and about 3 grams of copper sulfate per liter is used, and the reaction is allowed to proceed at room temperature for approximately 2 to 2.5 minutes for a sacrificial oxide layer 34 that is approximately 50 Angstroms thick. The time and temperature may be adjusted as necessary for the thickness of the sacrificial oxide layer 34, and to affect the rate of the reaction. The precise reaction that occurs in the copper plating process is unknown, but is currently believed to be:

$$Si + 2Cu^{2+} + 6\ F^- \rightarrow SiF_6^{2-} + 2Cu$$

The plating bath in a preferred embodiment is electroless, but an electrolytic bath may also be used. An electrolytic bath permits formation of a thicker metal seed layer 36 than an electroless bath, because electrons are continuously replaced by the electric current applied and therefore the metal ions, which have an electron affinity, may continuously plate to the barrier layer 32. If desired, the plating process may begin as an electroless process, and a voltage may later be applied to carry out an electrolytic plating process.

Figure 6:
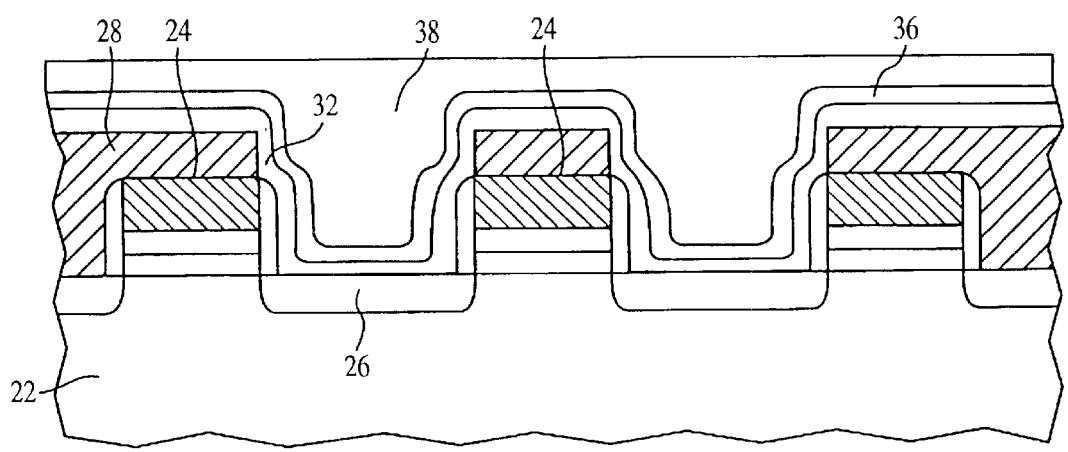
FIG. 6 shows the wafer of FIG. 1 at a processing step subsequent to that shown in FIG. 5.

A conductive layer 38 is now formed in the vias 30 to serve as an interconnect layer, as shown in FIG. 6. The conductive layer 38 is a layer of metal, which may be the same metal as the metal seed layer 36, or a different metal. Preferably the metal seed layer 36 and the conductive layer 38 are layers of the same metal. The conductive layer 38 is formed by an electrochemical deposition process such as electrolytic or electroless plating.

Preferably the conductive layer is formed by exposing the wafer 20 to a second plating solution by means such as immersion of the wafer 20 into a plating bath, or by spraying the second plating solution onto the wafer 20. The second plating solution is typically an aqueous solution of an acid such as sulfuric acid, a metal salt or complex that is soluble in the acid used, and several additives. Either electroless or electrolytic plating, or a combination of the two may be performed as desired for certain applications. In addition, any number of semiconductor wafers may be simultaneously processed by using a large bath, thereby reducing the cost of manufacture.

If the metal seed layer 36 and the conductive layer 38 are formed from the same metal, then the plating process may be carried out in the same plating bath that was used for formation of the metal seed layer 36, and may use the same plating solution. If the metal seed layer 36 and the conductive layer 38 are formed from different metals, then the same tank may be used for both plating processes if the first and second plating solutions are cycled through the tank. Subsequent to the plating process, conventional processing methods, such as planarization of the wafer 20 to isolate the conductive layer 38 into individual contact plugs, may then be used to create a functional circuit from the semiconductor wafer 20.

Figure 7:
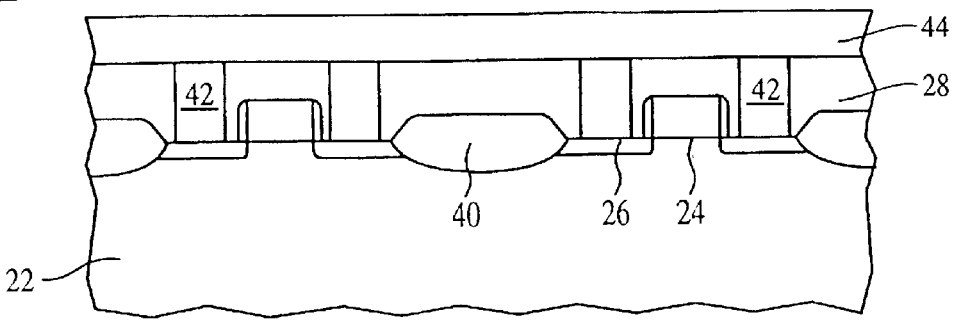
FIG. 7 is a cross-sectional view of a semiconductor wafer undergoing the process of a second preferred embodiment of the present invention.

A second embodiment of the present invention is illustrated by FIGS. 7 through 12. Referring to FIG. 7, a semiconductor device 120 contains devices 24, active areas 26, and field oxide regions 40 on a silicon substrate 22. A protective layer 28 has been formed over the device 120, and conductive plugs 42 extend through the protective layer 28 to contact the active areas 26. A protective layer 44 of a material such as BPSG, PSG, BSG, or silicon dioxide has been formed over the device 120 by CVD or other suitable means.

Figure 8:
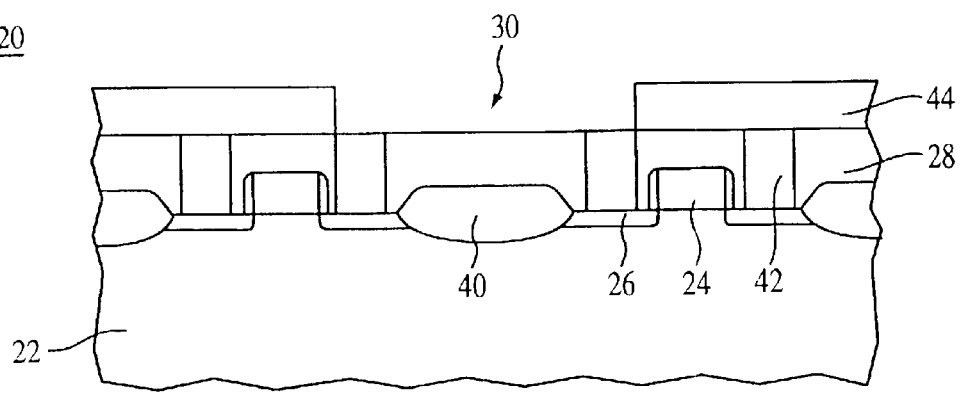
FIG. 8 shows the wafer of FIG. 7 at a processing step subsequent to that shown in FIG. 7.
Figure 9:
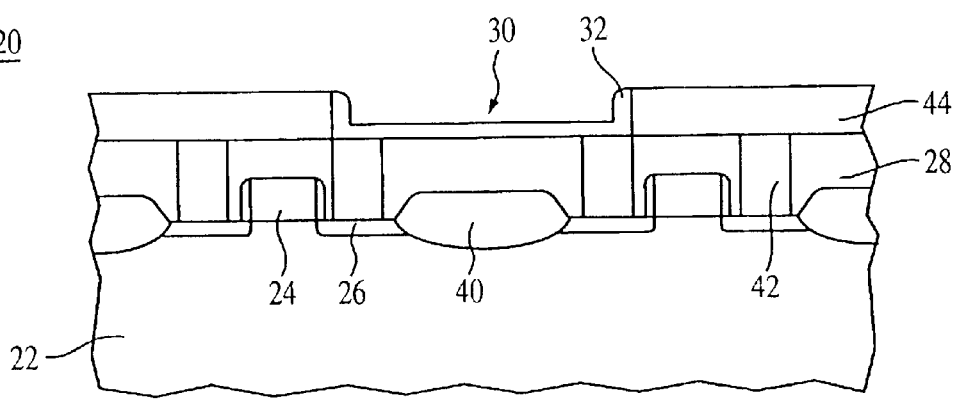
FIG. 9 shows the wafer of FIG. 7 at a processing step subsequent to that shown in FIG. 8.
Figure 10:
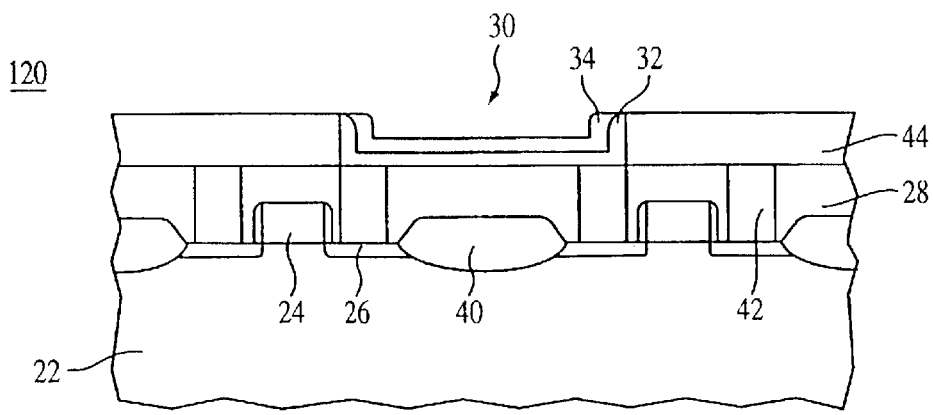
FIG. 10 shows the wafer of FIG. 7 at a processing step subsequent to that shown in FIG. 9.

Photolithographic techniques and subsequent etching are then used to define and form a damascene opening or trench 30, as shown in FIG. 8. Referring now to FIG. 9, a barrier layer 32 is now formed so that it overlies the protective layer 44 and lines the inside of the trench 30, as explained with reference to FIG. 3 above. Next, a sacrificial oxide layer 34 is formed over the barrier layer 32 and lining the inside of the trench 30, as shown in FIG. 10, and as further described with reference to FIG. 4 above.

Figure 11:
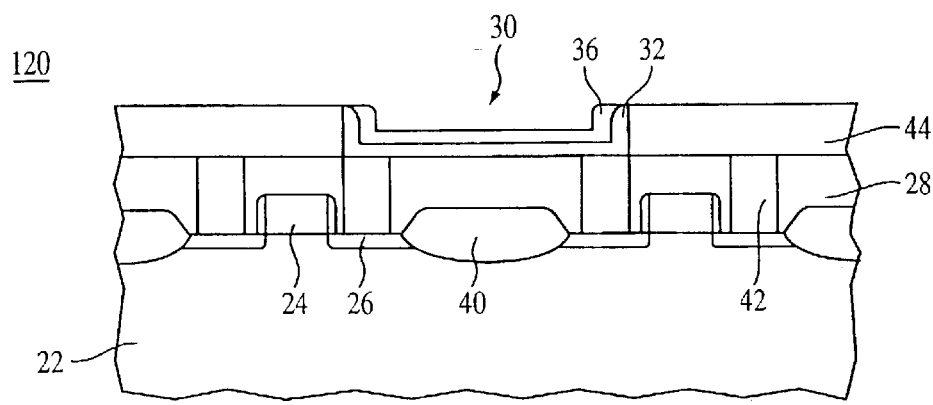
FIG. 11 shows the wafer of FIG. 7 at a processing step subsequent to that shown in FIG. 10.
Figure 12:
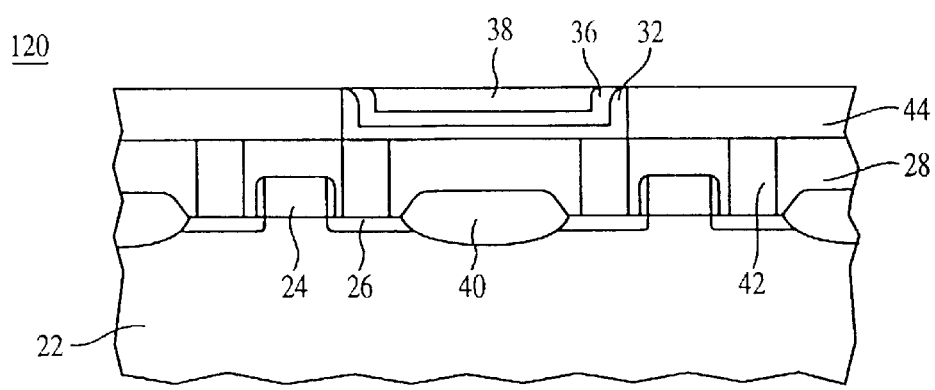
FIG. 12 shows the wafer of FIG. 7 at a processing step subsequent to that shown in FIG. 11.

FIG. 11 depicts the next step of the process, in which a metal seed layer 36 is now formed on the surface of the barrier layer 32 in the trench 30 by a redox plating process, as is described further above in reference to FIG. 5. Lastly, a conductive layer 38 is formed in the trench 30 to serve as an interconnect layer, as shown in FIG. 12. The conductive layer 38 is a layer of metal formed by an electrochemical process, as is described more fully with reference to FIG. 6 above. Subsequent to the plating process, conventional processing methods, such as planarization of the wafer 120, may then be used to create a functional circuit from the semiconductor wafer 120.

As can be seen by the embodiments described herein, the present invention encompasses methods of forming a metal seed layer via a redox reaction with a reducing agent. The reducing agent may be present in a sacrificial layer on the substrate to be plated, or may be in a non-sacrificial layer. It should again be noted that although the invention has been described with specific reference to semiconductor wafers, the invention has broader applicability, and may be used in any plating application in which a thin self-limiting seed layer is used.

The above description and drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a metal seed layer for a conductive pathway, comprising the steps of:
   providing a substrate;
   providing a barrier layer over the surface of the substrate;
   providing a reducing agent over the surface of the substrate; and
   forming a metal seed layer over said barrier layer by exposing the reducing agent to a first plating solution, said first plating solution comprising a first metal salt or a first metal complex that reacts with said reducing agent during said exposing.

2. The method of claim 1, wherein the barrier layer comprises the reducing agent.

3. The method of claim 1, wherein said barrier layer is a layer of material selected from the group consisting of titanium, titanium nitride, tantalum, tantalum nitride, tungsten nitride, tungsten-tantalum alloys, tantalum silicon nitride, and other ternary compounds.

4. The method of claim 1, wherein said barrier layer has a thickness within the range of approximately 50 to 500 Angstroms.

5. The method of claim 1, wherein said barrier layer has a thickness of approximately 300 Angstroms.

6. The method of claim 1, wherein a layer of silicon oxide over the barrier layer comprises the reducing agent.

7. The method of claim 6, wherein the silicon oxide layer is a layer of silicon dioxide.

8. The method of claim 6, wherein the silicon oxide layer is a layer of silicon monoxide.

9. The method of claim 6, wherein the silicon oxide layer has a silicon-to-oxygen ratio of greater than 0.5.

10. The method of claim 6, wherein the silicon oxide layer has a thickness within the range of approximately 10 to 200 Angstroms.

11. The method of claim 6, wherein the silicon oxide layer has a thickness within the range of approximately 10 to 50 Angstroms.

12. The method of claim 1, wherein the metal seed layer forming step comprises immersing the substrate in the first plating solution.

13. The method of claim 1, wherein the metal seed layer forming step comprises spraying the first plating solution on the substrate.

14. The method of claim 1, wherein the metal seed layer forming step is an electroless process.

15. The method of claim 1, wherein the metal seed layer forming step is an electrolytic process.

16. The method of claim 1, wherein said metal is selected from the group consisting of nickel, copper, ruthenium, rhodium, palladium, silver, osmium, iridium, platinum, gold, mercury and polonium.

17. The method of claim 1, wherein the first plating solution is an aqueous solution of copper sulfate and hydrofluoric acid.

18. The method of claim 1, wherein the first plating solution is a solution of approximately 1 part hydrofluoric acid per 100 parts water, and approximately 3 grams of copper sulfate per liter of first plating solution.

19. The method of claim 1, wherein said conductive pathway is formed over said metal seed layer by exposing the substrate to a second plating solution, said second plating solution comprising a second metal salt or a second metal complex.

20. The method of claim 19, wherein said second metal is selected from the group consisting of nickel, copper, ruthenium, rhodium, palladium, silver, osmium, iridium, platinum, gold, mercury and polonium.

21. The method of claim 19, wherein the first and second metals are the same.

22. The method of claim 19, wherein the first and second metals are different.

23. The method of claim 19, wherein the first and second plating solutions are the same.

24. A method of forming a metal seed layer for a conductive pathway, comprising the steps of:
   providing a substrate;
   providing a barrier layer over the surface of the substrate, wherein said barrier layer comprises a reducing agent; and
   forming a metal seed layer over said barrier layer by exposing the reducing agent to a first plating solution, said first plating solution comprising a first metal salt or a first metal complex that reacts with said reducing agent during said exposing.

25. A method of forming a metal seed layer for a conductive pathway, comprising the steps of:
   providing a substrate;
   providing a barrier layer over the surface of the substrate;
   providing a silicon oxide layer over the barrier layer; and
   forming a metal seed layer over said barrier layer by exposing the silicon oxide layer to a first plating solution, said first plating solution comprising a first metal salt or a first metal complex that reacts with said silicon oxide layer during said exposing.

* * * * *